United States Patent [19]

Bird

[11] Patent Number: 4,890,020
[45] Date of Patent: Dec. 26, 1989

[54] CIRCUIT FOR DRIVING A SEMICONDUCTOR DEVICE WITH PROTECTION AGAINST TRANSIENTS

[75] Inventor: Philip H. Bird, Sidcup, England

[73] Assignee: U.S. Philips Corporation, New York, N.Y.

[21] Appl. No.: 231,911

[22] Filed: May 27, 1988

[30] Foreign Application Priority Data

Jun. 8, 1987 [GB] United Kingdom ................. 8713384

[51] Int. Cl.$^4$ .................. H03K 17/687; H03K 5/153; H03L 5/00; B62D 45/00
[52] U.S. Cl. ..................................... 307/571; 307/575; 307/577; 307/583; 307/584; 307/362; 307/264; 307/270; 307/254; 307/10.1
[58] Field of Search ............... 307/571, 575, 577, 583, 307/584, 362, 264, 270, 253, 254, 10 R

[56] References Cited

U.S. PATENT DOCUMENTS

| | | | |
|---|---|---|---|
| 4,430,586 | 2/1984 | Hebenstreit | 307/270 |
| 4,461,966 | 7/1984 | Hebenstreit | 307/511 |
| 4,491,744 | 1/1985 | Corey | 307/571 |
| 4,691,129 | 9/1987 | Einzinger et al. | 307/270 |

FOREIGN PATENT DOCUMENTS

0201878 11/1986 European Pat. Off. ............ 307/575

Primary Examiner—Stanley D. Miller
Assistant Examiner—Trong Quang Phan
Attorney, Agent, or Firm—Bernard Franzblau

[57] ABSTRACT

An arrangement for driving a power semiconductor device (1) has an input (12) for receiving a control signal and a control output (11) for connection to the control electrode (9) of the power semiconductor device (1). The semiconductor device connected in series with a load (5) across a power supply (3,6). The arrangement includes an active turn-off device (T67) to achieve fast turn-off of the device (1). The arrangement further includes a threshold detecting means (29) which operates to turn on the semiconductor device in the event of a high voltage transient on the power supply. This reduces the voltage across the semiconductor device and hence reduces power dissipation within the semiconductor during transients. The turn-off device (T67) could be damaged by high transient currents when the threshold detecting means (29) conducts, so a further threshold detecting means (30) acts to disable the turn-off means (T67) during transients. The arrangement may be integrated monolithically with an associated semiconductor output device. An intelligent power switch circuit including such an arrangement is suitable for use in a motor vehicle.

16 Claims, 1 Drawing Sheet

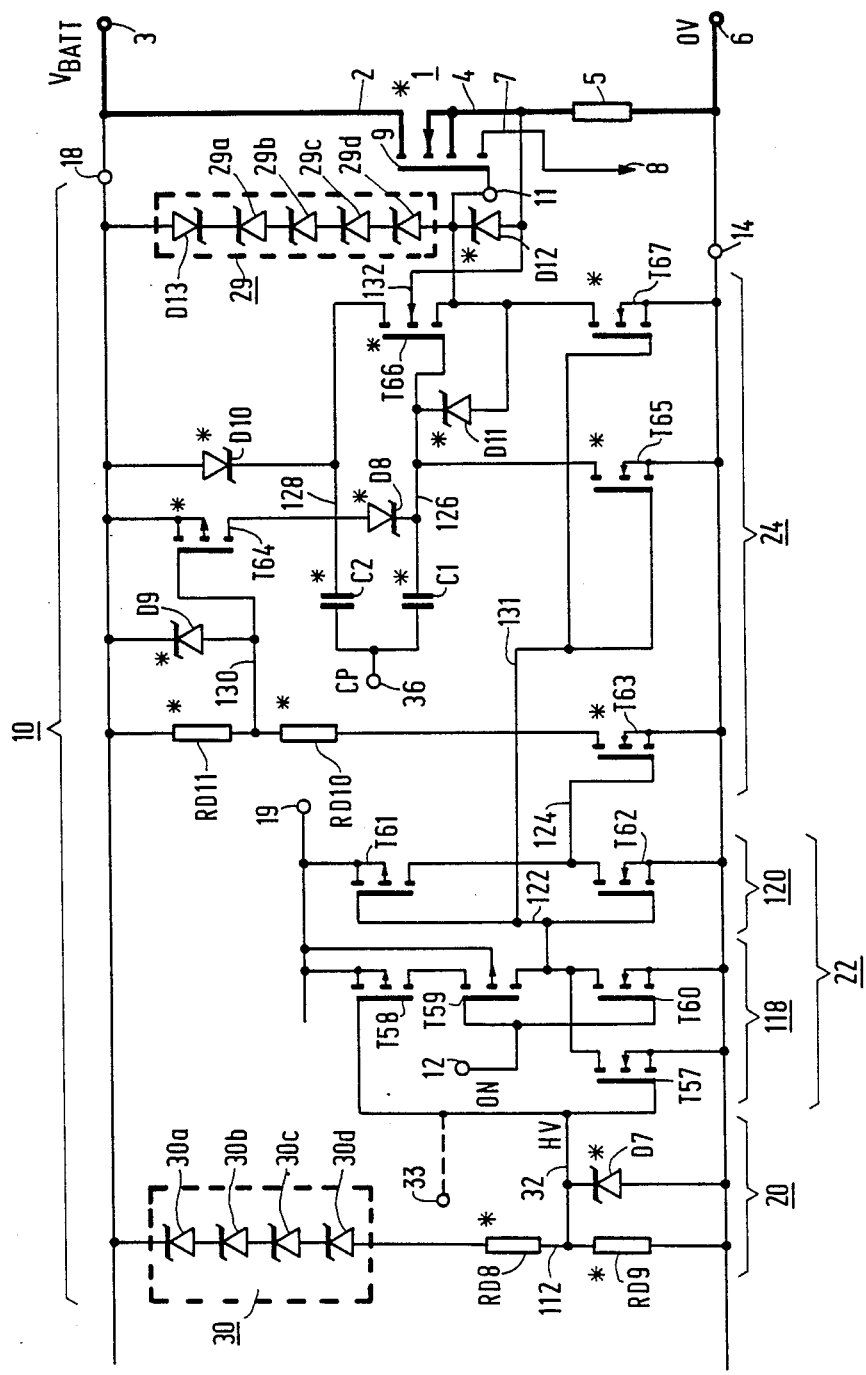

CIRCUIT FOR DRIVING A SEMICONDUCTOR DEVICE WITH PROTECTION AGAINST TRANSIENTS

BACKGROUND OF THE INVENTION

The invention relates to a circuit arrangement for driving a semiconductor device connected in series with a load across a power supply, the arrangement comprising means for applying appropriate signals to a control electrode of the semiconductor device in response to a control signal defining the desired state of conduction of the semiconductor device, means for detecting if the power supply voltage exceeds a predetermined threshold value and means for causing the semiconductor device to conduct by connecting the control electrode to a first terminal of the power supply when the threshold detecting means detect that the supply voltage exceeds the threshold value.

Such circuit arrangements are required in many applications for driving output transistors, thyristors, triacs and the like in electric power circuits. In a particular example, the semiconductor device and its associated circuit arrangement may act as an electronic switch for controlling a lamp or an electric motor.

In some applications, particularly where inductive elements form part of the system, such as in a motor vehicle, the voltage supply may be subject to high-voltage transients, or 'spikes' which could damage a semiconductor switch more easily than a traditional electromechanical switch. Excessive voltage leads to breakdown of junctions within the semiconductor device and possibly to permanent damage.

United Kingdom Patent Specification No. GB1534206 discloses such an arrangement and aims to alleviate this problem by turning on the semiconductor device when the supply voltage exceeds the threshold value regardless of the otherwise desired state.

The known arrangement makes use of the fact that the semiconductor device, a transistor, is more susceptible to damage by the transients when turned off (not conducting) because it then has the full voltage of the supply and transient applied across its main current carrying terminals. During a high voltage transient which causes a breakdown current to flow through the turned-off semiconductor device, this large voltage drop means that a large amount of energy may be dissipated within the semiconductor, causing damage by heating. In contrast, when the semiconductor device is on (conducting) the supply voltage (and therefore any transient superimposed upon the supply voltage) is applied mainly across the load being controlled, which will be constructed so as to withstand the transients as part of its normal operation. By turning the semiconductor device on during periods of excessively high voltage, even when the otherwise desired state of the device is the 'off' state, the load is made to drop at least some of the extra voltage. This reduces the heat energy generated within the semiconductor device to avoid damage. To provide effective protection, it is known that the threshold detecting means should act independently of the normal driving circuitry, connecting the control electrode as directly as possible to the first terminal of the supply in the shortest possible time.

A problem arises with the known arrangement where the application dictates that the seiconductor device must turn off quickly in response to a control signal. To achieve a fast turn-off, the means for applying signals to the control electrode may comprise active turn-off means for connecting the control electrode to a second terminal of the power supply when the desired state of conduction is 'off' (not conducting). This is effective to discharge quickly the large capacitance which is inevitably associated with the control electrodes of large power devices. For example, power metal-oxide-semiconductor field-effect transistors (MOSFETs) may have a gate capacitance of several tens or even hundreds of picofarads (pF), depending on the size and type of the power device.

However, combining the known directly-acting protection arrangement described above with an active turn-off means causes the problem that the turn-off means may be liable to damage by high currents during the ocurrence of a spike, because the protection arrangement serves to apply the full transient voltage across the turn-off means (for example a conducting pull-down transistor). One solution is to make the turn-off means have a sufficiently high resistance such that the transient current is limited to a safe level. A known circuit adopting this solution is Siemens' BTS412 intelligent power switch integrated circuit, described by J. Tihanyi and M. Glogolja in the Conference Record of the 1986 I.E.E.E. Industrial Applications Society Annual Meeting, at pages 429 to 433. See particularly the resistance RG in FIG. 2 on page 430. However, the high resistance required makes the turn-off arrangement less effective in achieving fast turn-off of the semiconductor device being driven by the arrangement.

SUMMARY OF THE INVENTION

It is an object of the invention to provide of an arrangement as set forth in the opening paragraph in which a fast turn-off of the semiconductor device can be achieved while minimizing the possibility of damage due to high-voltage transients.

The invention provides a circuit arrangement for driving a semiconductor device connected in series with a load across a power supply, the arrangement comprising means for applying appropriate signals to a control electrode of the semiconductor device in response to a control signal defining the desired state of conduction of the semiconductor device, means for detecting if the power supply voltage exceeds a predetermined threshold value and means for causing the semiconductor device to conduct by connecting the control electrode to a first terminal of the power supply when the threshold detecting means detect that the supply voltage exceeds the threshold value. The means for applying signals to the control electrode comprise an active turn-off device for connecting the control electrode to a second terminal of the power supply when the desired state of conduction is 'off' (not conducting. The invention is characterized in that the arrangement further comprises means for disabling the turn-off means when the supply voltage exceeds the threshold value. By disabling the turn-off means during the spike, damage to the turn-off means is avoided without significantly impairing its performance.

The means for connecting the control electrode to the first terminal of the supply may be arranged to act relatively directly on that electrode to override the means for applying the appropriate signals to the control electrode, the means for disabling the turn-off means being arranged to act relatively indirectly via the means for applying the appropriate signals to the control electrode. Such an arrangement may retain the fast response of the known directly-acting protection arrangement without disabling the turn-off means at the same instant. The turn-off means is disabled subsequently by the normal control circuitry, which can be soon enough after the start of the spike to limit transient heat dissipation within the turn-off means to a safe level.

The means for detecting if the power supply voltage exceeds the threshold value and for causing the semiconductor device to conduct may include a breakdown arrangement arranged for connection between the control electrode and the first terminal of the voltage supply, the breakdown arrangement comprising one or more semiconductor breakdown diodes connected in series so as to be reverse biased when the desired state of conduction is 'off' (not conducting). This provides a simple and fast-acting embodiment of the invention. The semiconductor breakdown diodes may be zener or avalanche types.

The breakdown arrangement may further comprise a semiconductor diode connected in series wih the breakdown diode(s) but with the opposite polarity so as to block forward conduction through the breakdown diode(s). Such a feature may be desirable if in some mode of operation, for example during the "on" state, the breakdown arrangement would otherwise be biassed into conduction and interfere with the performance of the circuit arrangement. Without the blocking diode, for example, the control output could not easily be raised to a voltage substantially beyond that of the first supply terminal.

The means for disabling the turn-off means may comprise a logic circuit for gating the control signal with an output of a further threshold detecting means. This enables the required protection to be provided by means of a relatively simple modification to the basic driving circuit. The further threshold detecting means may be combined with or be separate from the first-mentioned threshold detecting means.

Because of propagation delays involved in the operatin of the logic circuit, the directly-acting simple breakdown arrangement may still be advantageous to afford a more immediate response to a transient but, if the above modification is made in addition, the turn-off means will only be subject to a high current for a brief period while the logic signal propagates through the logic and driving circuitry. A further advantage of this modification is that the output of the threshold detection circuit may then also cause the arrangement to connect the control output to the first supply terminal by means of a pull-up transistor, for example. This can turn on a power semiconductor device connected to the control output more effectively than the simple breakdown arrangement which, although fast-acting, will not conduct below its breakdown voltage which is large compared with the voltage drop across a pull-up transistor.

The further threshold detecting means may comprise a potential divider arrangement connected across the power supply, one arm of the divider including one or more semiconductor breakdown devices for defining the threshold value. Such a potential divider arrangement may comprise a resistance device in series with one or more reverse biassed Zener or avalanche diodes. If the circuit arrangement is constructed using MOS transistors, the resistance may be provided as an MOS resistance device, making the threshold detecting means suitable for integration with the remainder of the circuit arrangement.

The means for applying signals to the control electrode may include a voltage source for applying to that electrode a signal at a voltage outside the range spanned by available supply voltages. A voltage source may be required, for example, if the semiconductor device to be driven is a MOS or bipolar transistor connected in common drain or common collector configuration, because then the gate or base voltage may have to be raised above the supply voltage to turn the device fully on.

The voltage source may comprise a charge pump circuit. A charge pump provides a readily integratable low-current voltage source, and may be particularly useful if the arrangement is to be used to drive the gate of a common-drain connected MOSFET, for example. The circuit arrangement may comprise means for generating an output signal for communicating to external circuitry that the threshold value has been exceeded.

The invention further provides an arrangement comprising a semiconductor output device and a circuit arrangement in accordance with the invention, the circuit arrangement being connected to a control electrode of the output device. The output device may, for example, be a DMOS power transistor. At least part of the circuit arrangement may be integrated on the same semiconductor as the output device.

The invention still further provides an intelligent power switch suitable for use in a motor vehicle or in a similar application. The intelligent power switch thus provides a semiconductor power switching arrangement with built-in protection against high-voltage transients.

BRIEF DESCRIPTION OF THE DRAWING

Embodiments of the invention will now be described, by way of example, with reference to the accompanying drawing, in which the single FIGURE is a circuit diagram of a circuit including an embodiment of a circuit arrangement according to the invention.

DESCRIPTION OF THE PREFERRED EMBODIMENTS

The FIGURE shows a circuit arrangement 10 in accordance with the present invention driving an n-channel metal-oxide semiconductor power transistor, power MOST 1. The MOST 1 has a drain electrode 2 connected to a first supply terminal 3 and a source electrode 4 connected to one terminal of a load 5, which is to be controlled. The other terminal of the load 5 is connected to a second supply terminal 6. The terminal 3 may, for example, be connected to the positive electrode of a motor vehicle battery and the terminal 6 may be connected to the vehicle chassis or ground. The MOST 1 also has a further source electrode 7, for connection at 8 to a current sensing circuit (not shown) as is known in the art.

The gate 9 of the MOST 1 is connected to the control output of the circuit arrangement 10 via terminal 11. The circuit arrangement 10 also has a control input connected to a terminal 12, and is connected via terminals 14 and 18 to the supply terminals 6 (OV) and 3 ($V_{BATT}$) respectively. The arrangement 10 is also connected via a low-voltage supply terminal 19 to the output of a voltage regulator (not shown) which may be at a voltage of 5 to 12 volts, depending on the regulator used.

A first breakdown arrangement 29 has a first end connected to terminal 18 ($V_{BATT}$) and a second end connected to the control output terminal 11, and so to the gate 9 of MOST 1. The first breakdown arrangement 29 comprises a series chain of diodes, starting with a blocking diode D13 which has its anode connected at the first end to terminal 18 ($V_{BATT}$). Four breakdown diodes 29a-29d are connected in series between the cathode of D13 and the output terminal 11. The breakdown diodes 29a-29d are connected in the opposite sense to diode D13, with the cathode of diode 29a being connected to the cathode of D13 and the anode of diode 29d being connected to the terminal.

In operation signals are generated at the terminal 11 by means to be described hereinafter and applied to the gate 9 of the MOST 1 to define whether the MOST 1 should be "on" (terminal 11 high) or "off" (terminal 11 low). In normal operation, the breakdown arrangement is effectively, an open-circuit, since either diode D13 or diodes 29a-29d will be reverse-biased. However, the first breakdown arrangement 29 will of course break down at a voltage which will depend on the number of diodes employed in series and the breakdown voltage of each one. The diodes 29a to 29d may be zener or avalanche breakdown diodes, and the chain of four breakdown diodes could be replaced by a chain of fewer or more diodes to achieve the desired threshold voltage. With four diodes as shown, the detected threshold for $V_{BATT}$ may be around 50 volts if each of the diodes 29a-29d has a breakdown voltage of around 12 volts.

When the voltage $V_{BATT}$ rises to a voltage above a threshold defined by the breakdown voltage of the first breakdown arrangement 29 however, the diodes 29a-29d which are normally reverse biased in the "off" state break down and form a low-resistance path, through the forward biassed diode D13, between the control output terminal 11 and the supply $V_{BATT}$. This has the effect of turning on the MOST 1 during high voltage transients, and provides an almost instantaneous response overriding the signals ordinarily applied to the gate of the MOST 1. It should be noted that the arrangement 29 will only conduct to the extent that it limits the voltage at the gate 9 of the MOST 1 to be not more than about 50V below $V_{BATT}$. The MOST 1 must therefore be able to withstand the power dissipation resulting from any transient currents at voltages up to that voltage, but in the present embodiment this is only true for the period immediately following the detection of the spike, as will be seen hereinafter. The diode D13 is provided to block forward conduction through the diodes 29a-29d, which would otherwise occur in the "on" state when the voltage at terminal 11 rises above $V_{BATT}$.

The arrangement 10 further includes a threshold detection circuit 20, a logic circuit 22 and a charge pump circuit 24. The threshold detection circuit 20 comprises a second breakdown arrangement 30 comprising four breakdown diodes 30a-30d connected in series, with the cathode of diode 30a connected to supply terminal 18 ($V_{BATT}$). The anode of diode 30d is connected to one end of a resistance device RD8, the other end of which is connected to supply terminal 14 (OV) via a further resistance device RD9. A further breakdown diode D7 is connected in parallel with RD9, with its anode connected to supply terminal 14 and its cathode connected to the junction 112 of RD9 with RD8. The junction 112 of resistance devices RD8 and RD9 forms an output 32 of the circuit 20, and carries a logic signal HV. A terminal 33 (shown dotted) may be connected to the output 32 (HV) to provide an indication of the signal HV to external circuitry, if required.

In normal operation, the output 32 is held low by RD9 since the voltage across the reverse-biased diodes 30a-30d is not sufficient to cause breakdown. Thus output 32 carries a signal HV=0 to indicate normal operation. If, however, an excessively high voltage transient occurs across supply terminals 14 and 18, diodes 30a-30d will break down and conduct, and the output 32 will be pulled high because of the low breakdown resistance of the diodes 30a-30d. Thus, during high-voltage transients or 'spikes' on the voltage supply, a signal HV=1 is provided at output 32. Diode D7 serves to limit the voltage applied to the input of the logic circuit 22 during spikes, to avoid damage to input transistors of the circuit 22.

The breakdown voltage of the second breakdown arrangement 30, which defines the threshold value of $V_{BATT}$ indicated by the signal HV=1, will be determined by the number of diodes in the series chain 30a-30d and upon the breakdown voltage of each one just as in the case of the first breakdown arrangement 29 described hereinbefore. If the further breakdown diode D7 also has a breakdown voltage of around 12 volts, and if $V_{LOW}$ is regulated so that the low-voltage supply voltage between terminals 14 and 19 is 12 volts, then diode D7 will limit the input to the low-voltage logic circuit 22 to be substantially within the range of the low-voltage supply.

Logic circuit 22 is made up of a two-input CMOS NOR gate 118, comprising four transistors T57-T60, and a CMOS inverter 120, comprising two transistors T61 and T62 and having an output 124. These CMOS circuits are connected to the low-voltage supply terminals 14 and 19. One input of the NOR gate 118 is connected to the control input terminal 12 while the other input of the NOR gate 118 is connected to the output 32 of the threshold detection circuit 20. The output 122 of NOR gate 118 is connected to the input of the inverter 120.

In operation, a signal ON is applied to the control input terminal 12 to define the desired state of the MOST 1. The logical-OR combination of signals HV and ON is available at output 124 while the complementary signal, the NOR combination, is available at 122. The outputs 122 and 124 together form the output of the logic circuit 22.

Charge pump circuit 24 includes two high-voltage n-channel transistors T63 and T65. The sources of T63 and T65 are connected to supply terminal 14 (OV), and their gates form a pair of complementary inputs which together form a gating input of the circuit 24. The gate of T63 is connected to the output 124 of logic circuit 22, while the gate of T65 is connected via a line 131 to the complementary (NOR) output 122 of the logic circuit 22. Another high voltage n-channel transistor T67 has its gate connected to line 131, and the sources of transistors T65 and T67 are connected to supply terminal 14 (OV).

A further input terminal 36 (CP) which is driven by an oscillator circuit (not shown) is connected to one plate of each of two capacitors C1, C2. The other plate of capacitor C1 is connected at 126 to the cathode of a diode D8, and also to the drain of T65. The anode of diode D8 is connected to the drain of a high voltage p-channel transistor T64, which has its source connected to supply terminal 18 ($V_{BATT}$). The other plate of capacitor C2 is connected at 128 to the cathode of a diode D10, whose anode is connected to supply terminal 18 ($V_{BATT}$).

The drain of n-channel transistor T63 is connected to one end of a resistance device RD10, which forms the input of a potential divider, comprising RD10 and another resistance device RD11. The junction between RD10 and RD11 is connected to an output of the potential divider, line 130, while the other end of RD11 is connected to terminal 18($V_{BATT}$). Line 130 is also connected to the gate of transistor T64 while a breakdown diode D9 is connected in parallel with RD11 with its cathode connected to terminal 18($V_{BATT}$) and its anode connected to the line 130.

The drain of transistor T67 is connected via control output terminal 11 to the gate 9 of power MOST 1. A further high-voltage n-channel transistor T66 has its gate connected to capacitor C1 at 126, its drain connected to capacitor C2 at 128, and its source connected to the gate 9 of the power MOST 1 via terminal 11. The transistor T66 has a separate back-gate electrode 132 which is connected to the source 4 of power MOST 1. A breakdown diode D11 is connected between the gate and source of transistor T66, with its anode connected to the source, while another breakdown diode D12 is connected similarly between gate 9 and source 4 of the power MOST1.

In operation, the signal at 124 and its complement at 122 determine whether the state of the power MOST 1 is 'on' (conducting) or 'off' (not conducting). In the 'on' state, when ON=1, the OR signal at 124 is high and the NOR signal at 122 is low, with reference to the low voltage supply at terminals 14 and 19. Thus, T63 conducts and T65 and T67 do not conduct. The potential divider RD10/RD11 acts as a level shifting circuit to enable the signal at 124 to control high-voltage transistor T64, and so, in the 'ON' state, T64 conducts to apply $V_{BATT}$ to the anode of D8. Breakdown diode D9 serves to limit the gate-source voltage applied to T64 at times of high supply voltage to avoid damage to T64. At the same time, terminal 36 (CP), which is connected to an oscillator (not shown) such as a ring oscillator, oscillates at a high frequency between two voltages determined by the output of the oscillator. For example, CP may oscillate substantially between the supply voltages $V_{BATT}$ and 0V, to use the maximum available swing, but if a smaller signal were desired, CP may for example oscillate between $V_{BATT}$ and some intermediate voltage. The choice of voltage for CP depends upon the particular voltage required at the gate 9 of the power MOST 1 for hard turn-on of that transistor.

When the oscillation takes CP (at 36) low, to 0V for example, both C1 and C2 charge via their respective diodes D8, D10, until they carry substantially the full supply voltage, minus the drop across the components in series with them. When CP then goes high, to $V_{BATT}$, C1 and C2 cannot discharge through the diodes D8 and D10, which become reverse-biased as the voltages at 126 and 128 rise to a level above $V_{BATT}$. The charge on C1 is then shared with the gate capacitance of transistor T66, which is thus turned on, and the charge on C2 can then flow through T66 and the output terminal 11 and is shared with the gate capacitance of the power MOST 1. This process repeats for each cycle of the input CP until, after some number of oscillations, the gate 9 of power MOST 1 is held at a voltage $V_G$ several volts above $V_{BATT}$, thereby achieving hard turn-on of the power MOST 1. The ultimate value of $V_G$ is given approximately by the formula:

$$V_G = V_{BATT} + \Delta V_{CP} - V_{BE} - V_{TH},$$

where $\Delta V_{CP}$ is the peak to peak amplitude of the ocillations of the signal CP, $V_{BE}$ represents the forward voltage drop across the diode D10 and $V_{TH}$ is the voltage drop across the transistor T66 when it is turned on. It should be noted that if, for convenience in integration or for some other reason, the diode D10 is constructed as a breakdown diode, the value of $V_G$ achievable will be limited by the breakdown voltage of that diode. The gate 9 is prevented from discharging again during the time when CP is low, because then T66 is turned off so that T66 acts as a synchronous rectifier.

By a suitable choice of values for capacitors C1 and C2, and the frequency of oscillation of the signal CP, the rate at which the load is turned on can be controlled. It may be desirable to energise a load such as a filament lamp slowly, to avoid a large 'inrush' current when the filament is cold. Such currents are potentially damaging, for example to thin wires bonded to the power semiconductor for connection to the load.

The connection of the back-gate region of transistor T66 to the source 4 of the power MOST 1, rather than to the source of T66 itself or to 0V, is advantageous when the circuit arrangement 10 and power MOST 1 comprise an integrated circuit since it is likely that the semiconductor substrate, in which the low power devices such as T66 are formed, will also be the drain region of the power MOST 1. This is the case, for example, where MOST 1 is a vertical power MOSFET, and if the transistor T66 is integrated without isolation from the power MOST 1 then the n-type substrate in which T66 is formed is connected to $V_{BATT}$. If the p-type region forming the back-gate 132 of T66 were shorted to the source of T66 in the conventional manner, the source of T66, and hence the gate 9 of power MOST 1 would be prevented from rising above $V_{BATT}$ as required, because the p-n junction between the back gate 132 and the substrtate would then be forward biased. To avoid this problem, the back gate 132 could be tied to some fixed reference voltage, such as 0V, but whatever voltage was chosen, this would apply an excessive back-bias to T66 at some stage or other in the operation, so that the effectiveness of the circuit would be impaired and T66 would need to be constructed to withstand such a high back-bias without breakdown.

The connection of the back gate 132 as shown in the figure enables simple integration to be achieved, and T66 always has a small back-bias voltage applied because when the MOST 1 is turned on, the source 4 of MOST 1 rises along with its gate 9 to approximately $V_{BATT}$. Another advantage gained by connecting the back-gate 132 of T66 to the source of the output device is that the p-n junction described above is then connected so as to act as diode D12, so that D12 need not be separately provided. Diode D12 is a zener or avalanche breakdown diode and serves to limit the gate-source voltage applied to MOST 1. Breakdown diode D11 performs the identical function for T66. The breakdown voltage of these diodes is a matter of choice, but when the circuit is constructed as an integrated circuit, integrated diodes may conveniently be formed at the same time as the MOS transistors having breakdown voltages of 12 to 14 volts. Diodes D8 and D10 are not required to act as breakdown diodes, but in this embodiment they are breakdown diodes as shown and are identical to the other diodes, for convenience in manufacture.

In the 'off' state, when input terminal 12 goes low (ON=0, and assuming HV=0 for the moment), then T63 and T64 are turned off. The oscillator (not shown) also responds to the signal ON=0 and no oscillatory signal is applied to input 36 (CP). Thus diode D8 is disconnected from $V_{BATT}$ and transistors T65 and T67 are turned on by the output 122 of logic circuit 22 via the line 131. Thus, the gate of T66 is pulled toward OV, and T66 turns off, disconnecting the gate 9 of the power MOST 1 from the supply, so turning off the MOST 1 and de-energising the load 5. Transistor T67 is provided because the gate capacitance of the large-area power MOST 1 is very large and requires an active pull-down to achieve fast turn-off. When particularly fast turn-off is required, the transistor T67 may be constructed with a larger channel cross-section than the other transistors so that it has a particularly low on-resistance.

Because the first breakdown arrangement 29 acts directly and independently during a spike to connect the terminal 11 to the supply terminal 18 ($V_{BATT}$), the turn-off transistor T67 would be liable to damage by large transient currents if it were not for the subsequent action of the section breakdown arrangement 30. An alternative solution which might be adopted to reduce this problem would be to construct the turn-off transistor with a higher value of on-resistance so that the transient currents are limited. Unfortunately, this high on-resistance degrades the performance of the turn-off transistor in its normal operation, and in cases where high performance is essential it has been found that there is no acceptable compromise value.

In the circuit shown, when a spike occurs, the second breakdown arrangement 30 breaks down (at approximately the same time as the first breakdown aarrangement 29) and the signal HV=1 appears at the output 32 of the threshold detecting circuit 20. This signal HV=1 can override the signal ON=0 because it is the logical combination ON+HV which activates the charge pump circuit 24. Signal HV=1 need not necessarily activate the oscillator (not shown), however, for example if the time the oscillator would take to start is too long for it to be of use in immediate response to a spike.

If the circuit 20 detects that $V_{BATT}$ exceeds the predetermined threshold and generates a signal HV=1 at its output 32 during the 'off' state, when ON=O, then the OR output 124 of the logic circut 22 changes from '0' to '1' and T63 is turned on, so turning on T64 for the duration of the excessive voltage. Although the charge pump circuit 24 is unable to drive the gate 9 of the power MOST 1 to a voltage above $V_{BATT}$ when no oscillations are applied to input 36, transistor T66 is still turned on by T64 sufficiently for it to draw gate 9 at least within a few volts of $V_{BATT}$, via diode D10. At the same time, of course, the NOR output $V_{BATT}$, via diode D10. At the same time, of course, the NOR output 122 of the logic circuit 22 changes from '1' to '0', and via line 131 turns off transistors T65 and T67 to break the connection between OV and the gates of transistor T66 and MOST 1 respectively.

There is a propagation delay through the circuitry 22 and 24, so that there may be a short delay dependent on the integration technology used which may be of the order of a microsecond or so from the breakdown of the arrangement 30 to the turning-on of transistor T64 and T66 and the turning-off of pull-down transistors T65 and T67. For this reason, the first breakdown arrangement 29 is still desirable in order to save the MOST 1 from immediate damage by a high-voltage transient during that microsecond delay, but the subsequent action in response to the signal HV=1 has two important benefits.

First, the turn-off transistor T67 is subjected to transient currents only during the propagation delay period mentioned above. Thus, the transistor T67 need not be constructed with such a high on-resistance as would be necessary to withstand the full duration of the transient current, and its performance need not be so degraded in consequence. The second benefit of providing the circuit 20 is that by turning-on the transistors T64 and T66 for the latter part of the spike, the protection of the MOST 1 itself is also improved. The voltage drop across the transistors T64 and T66, via the diode D10, will be only a few volts, whereas it will be recalled that the voltage drop across the arrangement 29 during a transient cannot go below the breakdown voltage, namely 50V in this example. Thus, after a short delay, the MOST 1 is turned-on harder for the remaining part of the spike, and power dissipation (i.e. heat generated) is reduced accordingly.

It should be noted that where the circuit arrangement is used to drive a power MOSFET and at the same time to protect the power MOSFET against positive-going spikes on the supply (where $V_{BATT}$ itself is positive), as described in the preceding paragraph, the power MOSFET is also protected against negative-going spikes, and indeed against inadvertent reverse-polarity connection of the supply. This protection arises for power MOSFETs, for example the MOST 1 shown in the figure, because under reverse-supply conditions the pn junction between the drain region and the body region of an n-channel MOSFET becomes forward biassed, and the negative voltage is taken entirely across the load, just as in the case of a positive-going spike. This p-n junction may also be of use as a flywheel diode when driving inductive loads. It will be apparent that such an inherent immunity to a reverse-polarity supply is due to a feature of MOSFET construction, and immunity may not be inherent in, say bipolar power devices.

From reading the present disclosure, modifications will be apparent to persons skilled in the art. Such modifications may involve other features which are already known in the design and use of power semiconductor devices, and associated circuitry, and component parts thereof and which may be used instead of or in addition to features already described herein. Although claims have been formulated in that application to particular combinations of features, it should be understood that the scope of the disclosure of the present invention also includes any novel feature or any novel combination of features disclosed herein either explicitly or implicitly or any generalisation of one or more of those features which would be obvious to persons skilled in the art, whether or not it relates to the same invention as presently claimd in any claim and whether or not it mitigates any or all of the same technical problems as does the present invention.

I claim:

1. A circuit arrangement for driving a semiconductor device adapted to be connected in series with a load across a power supply, the arrangement comprising; means coupled to a control electrode of the semiconductor device for applying appropriate signals to said control electrode in response to a control signal defining a desired state of conduction of the semiconductor device, means coupled to the power supply for detecting the power supply voltage and for causing the semiconductor device to conduct by connecting said control electrode to a first terminal of the power supply when the detecting means detect that the supply voltage exceeds a predetermined threshold value, the means for applying signals comprising an active turn-off device arranged to connect the control electrode to a second terminal of the power supply in response to a control signal indicating that the desired state of conduction is 'off', and means coupled to the active turn-off device for disabling said turn-off device when the supply voltage exceeds the threshold value.

2. A circuit arrangement as claimed in claim 1, wherein the means for detecting power supply voltage and for connecting the control electrode to the first terminal of the power supply is arranged to act relatively directly on said control electrode so as to override the means for applying appropriate signals to the control electrode, whereas the means for disabling the turn-off device is arranged to act relatively indirectly via the means for applying.

3. A circuit arrangement as claimed in claim 2, wherein the means for detecting and for causing the semiconductor device to conduct includes a breakdown arrangement connected between the control electrode and the first terminal of the voltage supply, the breakdown arrangement comprising one or more semiconductor breakdown diodes connected in series so as to be reverse biased when the desired state of conduction is 'off' (not conducting).

4. A circuit arrangement as claimed in claim 3, wherein the breakdown arrangement further comprises a semicondctor diode connected in series opposition with the one or more breakdown
diodes so as to block forward conduction through the breakdown diode(s).

5. A circuit arrangement as claimed in claim 1, wherein the turn-off device comprises a transistor connected between the control electrode and the second supply terminal, the means for applying signals to the control electrode including means coupled to the transistor for driving the transistor in response to the control signal.

6. A circuit arrangement as claimed in claim 1, wherein the means for applying includes further threshold detecting means and the means for disabling the turn-off device comprises a logic circuit coupled to said further threshold detecting means for gating the control signal with an output signal of said further threshold detecting means.

7. A circuit arrangement as claimed in claim 6, wherein the further threshold detecting means comprises a potential divider arrangement connected across the power supply, the divider including one or more semiconductor breakdown devices for defining a voltage threshold value.

8. A circuit arrangement as claimed in claim 1, wherein the means for applying signals includes a voltage source coupled to said control electrode for applying thereto a signal at a voltage level outside the range spanned by available supply voltages.

9. A circuit arrangement as claimed in claim 6, further comprising means coupled to said further threshold detecting means for generating an output signal for communicating to external circuitry that the threshold value has been exceeded.

10. A circuit arrangement as claimed in claim 1, wherein at least part of the arrangement comprises an integrated circuit.

11. An arrangement comprising, in combination, a semiconductor device and a circuit arrangement as claimed in claim 1, the circuit arrangement being connected to a control electrode of the semiconductor device, wherein at least part of the circuit arrangement is integrated on the same substrate as the semiconductor device.

12. An intelligent power switch suitable for use in a motor vehicle comprising an arrangement as claimed in claim 11.

13. A circuit for driving a semiconductor power device on and off comprising:
an input terminal for an input control signal that defines the on/off state of the semiconductor device,
an output terminal for supplying a drive control signal to a control electrode of the semiconductor device as determined by said input control signal,
means for coupling said semiconductor device in series with a load across first and second terminals of a source of supply voltage,
a voltage threshold detector coupled to said first voltage supply terminal and to said control electrode for driving said semiconductor device into conduction when the voltage at said first voltage supply terminal exceeds a given voltage threshold level,
an active semiconductor turn-off device for coupling said control electrode to said second voltage supply terminal when said input control signal defines the off state of the semiconductor device, and
means coupled to said first voltage supply terminal and to a control electrode of the active semiconductor turn-off device for disabling said active turn-off device when the voltage at said first voltage supply terminal exceeds said given voltage threshold level.

14. A circuit as claimed in claim 13 wherein said disabling means comprise:
a second voltage threshold detector coupled to said first supply terminal and via at least one transistor to said control electrode of the active semiconductor turn-off device thereby to disable the active turn-off device when the voltage at said first supply terminal exceeds said given voltage threshold level.

15. A circuit as claimed in claim 14 further comprising:
means for coupling said control electrode of the active semiconductor turn-off device to said input terminal such that the active semicondutor turn-off device is controlled at least in part as a function of the input control signal.

16. A circuit as claimed in claim 13 wherein said semiconductor device comprises a power MOST device having a source electrode, said circuit further comprising a charge pump circuit coupled to said input terminal and via an FET device to the control electrode of the power MOST device, and
means directly connecting a back gate of said FET device to said source electrode of the power MOST device.

* * * * *